United States Patent [19]

Smith et al.

[11] Patent Number: 4,661,203
[45] Date of Patent: Apr. 28, 1987

[54] LOW DEFECT ETCHING OF PATTERNS USING PLASMA-STENCIL MASK

[75] Inventors: Donald O. Smith, Lexington; John R. Burgess, Dunstable; David M. Walker, Westford, all of Mass.

[73] Assignee: Control Data Corporation, Minneapolis, Minn.

[21] Appl. No.: 749,788

[22] Filed: Jun. 28, 1985

[51] Int. Cl.⁴ .................. B44C 1/22; B29C 37/00; C03C 15/00; C03C 25/06
[52] U.S. Cl. .................. 156/643; 156/646; 156/655; 156/659.1; 156/668; 156/345; 204/192.32; 204/298
[58] Field of Search ............ 156/643, 646, 655, 659.1, 156/668, 345; 204/192 E, 298; 118/728, 50.1, 620; 427/38, 39, 43.1

[56] References Cited

U.S. PATENT DOCUMENTS 4,119,688 10/1978 Hiraoka .................. 156/345 X
4,158,589 6/1979 Keller et al. .................. 156/345
4,523,971 6/1985 Cumo et al. .................. 156/646 X

OTHER PUBLICATIONS

Asch et al., Structuring a Photoresist Layer by Reactive Ion Etching, IBM Technical Disclosure Bulletin, vol. 26, No. 2, Jul. 1983, p. 685.

Primary Examiner—William A. Powell
Attorney, Agent, or Firm—Charles W. Helzer; Ira C. Edell

[57] ABSTRACT

Resist coating on the surface of a semiconductor wafer is removed by a one-step process using anisotropic reactive ion etching through an apertured stencil disposed close to but spaced from the resist-coated surface. The ion bombardment greatly enhances the plasma etch rate in the areas of the coating exposed through stencil apertures so that only the exposed areas are effectively etched during the limited exposure time in spite of the presence of chemically reactive gas between the stencil and other areas of the wafer surface. The technique is limited by low resolution but is ideally suited for clearing resist from atop fiducial marks used to align the wafer with multiple wafers in an integrated circuit chip.

16 Claims, 2 Drawing Figures

LOW DEFECT ETCHING OF PATTERNS USING PLASMA-STENCIL MASK

TECHNICAL FIELD

The present invention relates to etching patterns on a semiconductor surface and, more particularly, to an inexpensive technique for etching patterns which do not require high etching resolution.

BACKGROUND OF THE INVENTION

One of the major problems involved in manufacturing semiconductor integrated circuits is achieving layer-to-layer registration of successive patterns required to form a working circuit. Typically, ten to fourteen layers must be registered in an overall working chip. In order to achieve the required registration it is common practice to place fiducial marks on the wafer. These fiducial marks can be detected by either light or electrons and serve as reference points from which to adjust the geometry of pattern exposure for registering the pattern of one wafer with the pattern of another. Fast and accurate registration requires a good signal-to-noise ratio during fiducial mark detection; however, since semiconductor wafers are coated with "resist" material prior to exposure of the circuit pattern, the fiducial mark must be read through the resist material with consequent loss of signal and degraded signal-to-noise ratios. This problem becomes more acute as the pattern feature sizes become smaller for two reasons: (1) since the features are smaller, registration must be more accurate; and (2) the resist material may become thicker since multiple layers of different materials are required in order to improve the resolution of the exposure and subsequent processing steps. Therefore, it would be desirable to have a simple method of removing the resist material from the area directly over the fiducial mark in order to maximize the signal when reading the fiducial mark position.

The most obvious way of clearing fiducial marks would be to introduce an additional conventional exposure and development step in the process. However, this approach only works with positive-acting resist material and would invariably introduce defects and reduce the yield of the final chips. Hence, there is clearly a need for a very low defect lithographic process to be used specifically for clearing fiducial marks.

OBJECTS AND SUMMARY OF THE INVENTION

It is therefore an object of the present invention to provide a method and apparatus for etching patterns on a semiconductor surface without having to utilize a conventional lithographic step requiring exposure and development of photo or electron resist material.

It is another object of the present invention to provide a method and apparatus for exposing fiducial marks on semiconductor wafers without requiring conventional exposure and development of photo or electron resist material.

It is another object of the present invention to provide a method and apparatus for clearing resist material from fiducial marks on semiconductor wafers in a manner which introduces fewer defects than produced by conventional lithography.

In accordance with the present invention, in seeking to develop a low defect process for clearing fiducial marks, it is important to note that the resolution of the clearing process need not be nearly as great as is required for the circuit pattern features themselves. That is, the number of fiducial marks is relatively small compared to the total number of circuit features; therefore, an area much larger than the fiducial mark itself may be cleared without significant loss of usable silicon area. Furthermore, fiducial marks are commonly placed in the scribe lines between chips, which lines are typically several mils wide (one mil being equal to 25 micrometers). Hence, the ideal fiducial clearing process would be a one-step, defect-free, low-resolution process. We have found that plasma etching, through a stencil mask, is an appropriate method meeting these requirements. More specifically, a plasma stencilling technique based on anisotropic reactive ion etching provides for effective and efficient clearing of the fiducial mark areas of a resist-coated semiconductor wafer surface. The wafer is placed in a vacuum chamber on a platen, or the like, and the stencil is supported by spacers in closely spaced relation to the wafer. An etching gas is introduced into the chamber and has at least one component which reacts chemically with the resist coating material to form a volatile reaction plasma. A radio frequency signal is applied between the platen and the grounded chamber wall. The platen, the wafer and the stencil are electrically interconnected so as to be at the same potential whereby the stencil and the wafer serve as a common driven electrode (i.e., a cathode) and the chamber wall serves as the other electrode. The plasma potential is quite low with respect to ground but the cathode develops a negative d.c. self-bias. This bias causes energetic ion bombardment of the wafer surface through the stencil apertures, thereby greatly enhancing the plasma etch rate in these areas. At low pressures, where the ion mean free path is long, the ions travel through the stencil and strike the wafer surface at a substantially perpendicular angle. Therefore, even though there may be chemically reactive gas between the stencil and the wafer, only the areas under the stencil apertures are exposed to the ion bombardment which enhances the etch rate and produces selective etching in these areas.

BRIEF DESCRIPTION OF THE DRAWINGS

These and other objects, features and many of the attendant advantages of the present invention will be appreciated more readily as they become better understood from a reading of the following description considered in connection with the accompanying drawings wherein like parts in each of the several figures are identified by the same reference characters, and wherein.

DESCRIPTION OF THE PREFERRED EMBODIMENT

Figure 1:
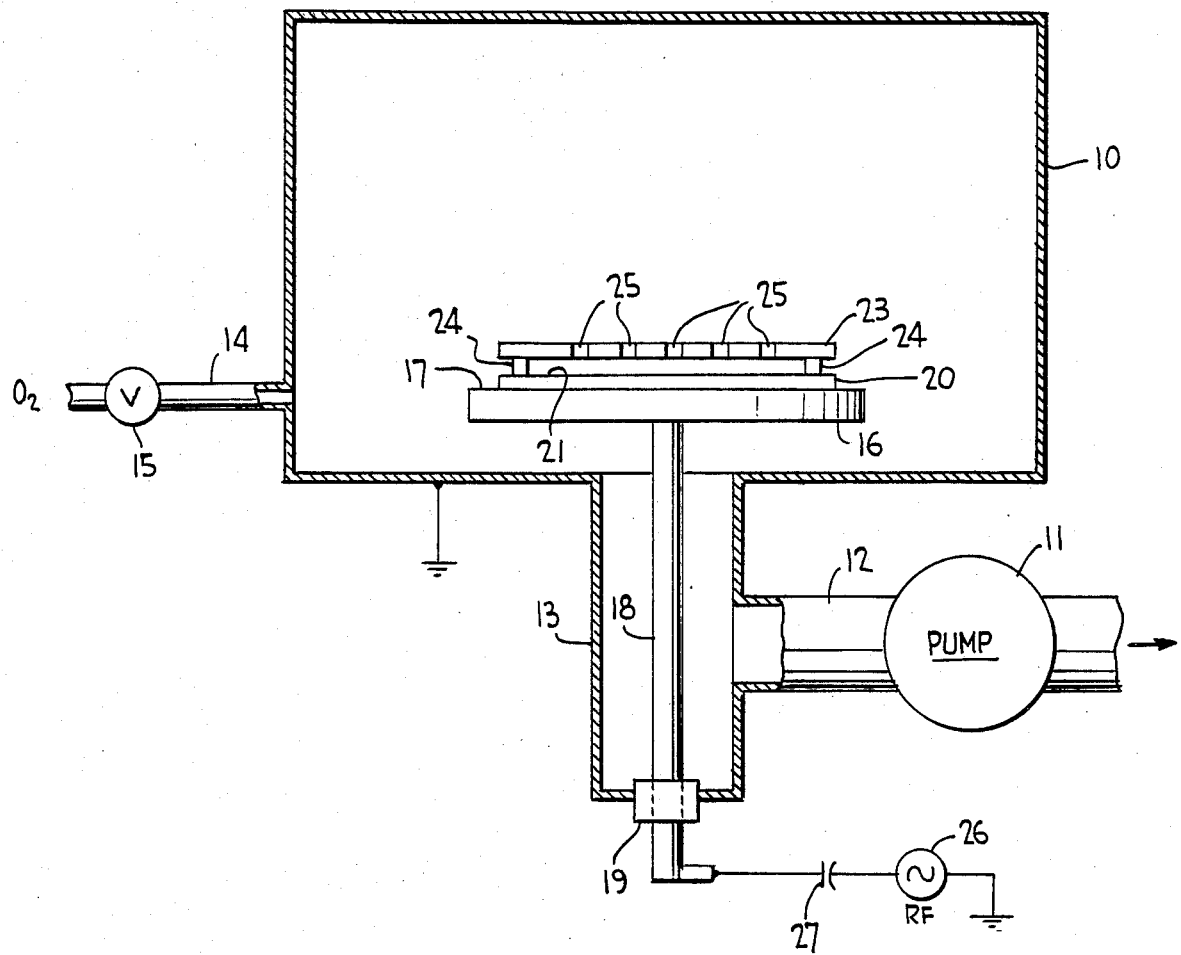
FIG. 1 is a diagrammatic and partially schematic view in cross-section of apparatus constructed in accordance with the present invention.

Referring specifically to FIG. 1 of the accompanying drawings, a vacuum chamber 10 is evacuated by means of a pump 11 which lowers the pressure in chamber 10 to the "vacuum" pressure required to effect reactive ion etching. In this regard, reference is made to the monograph by J. W. Coburn entitled "Plasma Etching and Reactive Ion Etching" from the American Vacuum Society Monograph Series, published by the American Institute of Physics, Inc., New York, New York, 1982, Library of Congress Catalog Card No. 82-73342. This Coburn monograph provides an excellent detailed description of reactive ion etching and is expressly incorporated herein in its entirety by this reference. Pump 11 communicates with the interior of chamber 10 via an exhaust passage 12 opening into a depending hollow stem portion 13 of the chamber. A supply passage 14 communicates with the interior of chamber 10 and supplies etching gas to the chamber under the control of a valve 15. In the illustrated embodiment the etching gas is oxygen. In general, however, the etching gas is chosen so as to produce species which react chemically with the material to be etched to form a reaction product which is volatile. The etch product then spontaneously desorbs from the etched material into the gas phase where it is removed from the chamber by pump 11. The key requirement is the volatility of the etch product. The etching gas itself does not necessarily react with the surface being etched; rather, the reactive components are formed by dissociating the relatively inert etching gas into reactive fragments. In the case of etching a carbonaceous material in an oxygen plasma, the etching species are oxygen atoms and the volatile etch products are predominantly carbon monoxide, carbon dioxide and water.

A support or platen 16 is disposed within chamber 10 with its support surface 17 horizontally disposed. Platen 16 is supported by means of a support rod 18 extending vertically through the depending stem portion 13 of the chamber. Both the platen 16 and rod 18 are electrically conductive and are spaced, and therefore electrically insulated, from the chamber walls which are electrically grounded. An electrical vacuum feedthrough coupler 19 provides electrically insulated feedthrough of rod 18 through the chamber wall at the lower end of the stem portion 13.

The semiconductor wafer 20 to be etched is placed on support surface 17 of platen 16 with a resist-coated surface 21 to be etched facing away from support surface 17 (i.e., upwardly in FIG. 1). The wafer 20 is in electrical contact with platen 16. A stencil or mask 23 is supported by spacer members 24 in closely spaced relation to the resist-coated surface 21 to be etched. Spacer members 24 are electrically conductive so that the wafer 20 and stencil 23 are at the same potential. One or more apertures are defined in the stencil which is positioned over the wafer surface 21 so that each aperture is directly aligned over a corresponding fiducial mark area on surface 21.

A source 26 of radio-frequency (r-f) potential is disposed outside chamber 10 and has one terminal coupled via capacitor 27 to the conductive rod 18 protruding from the chamber stem portion 13 and feedthrough coupler 19. The other terminal of the r-f source 26 is connected to circuit ground. It will be appreciated, therefore, that the r-f potential from source 26 is applied across two electrodes. The first electrode is constituted by stencil 23 and wafer 20 which are connected to source 26 via platen 16, rod 18, coupler 19 and capacitor 27. The second electrode is constituted by the grounded walls of chamber 10.

Figure 2:
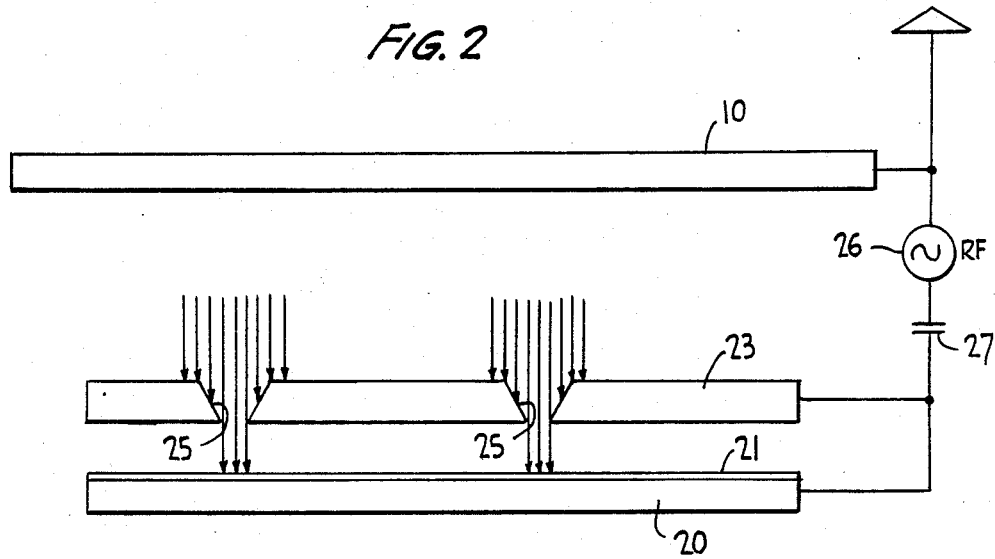
FIG. 2 is an electrical schematic diagram of the apparatus of FIG. 1.

The operation of the invention is best understood from the schematic illustration of FIG. 2 wherein the grounded walls of chamber 10 are represented by a lumped parameter electrode 10. Stencil 23 has apertures 25 cut therein to correspond to the portions of resist coating 21 to be cleared. These would ordinarily be areas in which fiducial marks are present in the wafer surface and the areas are typically configured as twenty-five micrometer squares. In this regard, the apertures would ordinarily be of square configuration but could be any desired shape. The spacing between the wafer 20 and stencil 23 can be as much as twice the largest dimension of aperture 25, or 50 micrometers in the present example of a twenty-five micrometer square. Since the fiducial marks themselves are generally only between one and five micrometers in their largest dimension, and the unused space between chips is between seventy-five and a hundred micrometers, the alignment between stencil 23 and wafer 20 need not be very accurate and can be off-centered by as much as ten micrometers. An optical alignment system can be used under such circumstances.

The plasma stencilling process is based on the anisotropic reactive ion etching techniques developed for the semiconductor fabrication industry and described in the aforementioned Coburn monograph. If the cathode area, in this case the wafer and stencil, is much smaller than the grounded chamber wall area, the plasma potential is quite low with respect to ground; however, the driven electrode (i.e., the cathode) develops a negative d.c. self-bias. This self-bias causes energetic ion bombardment of the wafer surface 21, thereby greatly enhancing the plasma etch rate and producing anisotropy. At low pressures, where the ion mean free path is long, the ions travel through the stencil apertures 25 and strike the wafer surface 21 at a nearly normal angle. Thus, even though there may be chemically reactive gas between the stencil 23 and wafer 20, the areas under the stencil apertures 25 are exposed to ion bombardment which enhances the etch rate and produces selective etching during the limited period of time during which the wafer is exposed to the etching gas.

Typically, the spacing between stencil 23 and surface 21 of the wafer is between one and two times the largest dimension of aperture 25 in the stencil. The stencil cannot be placed in contact with the wafer since doing so would tend to damage the resist coating on the wafer. Specifically, particulates on the bottom surface of the stencil would be transferred to the surface 21, thereby tending to scratch the resist coating. The coating must be kept exceptionally clean during the subsequent exposure of the circuit components.

As noted from FIG. 2, the apertures 25 are illustrated as being formed with a tapered configuration such that the aperture is wider at the top surface of the stencil 23 than at the bottom surface. It is the smallest dimension, namely the dimension at the bottom surface of the stencil, which is the controlling dimension for purposes of exposing areas to be cleared in the photoresist coating 21. The tapered configuration for apertures 25 is desirable only from the standpoint of facilitating the formation of the apertures but has no functional advantage during the reactive ion etching process.

The plasma-stencil method and apparatus of the present invention as described herein introduces fewer defects in the semiconductor wafer than are caused by conventional lithography. On the other hand, the resolution provided by the present invention is limited to features which are no smaller than approximately 20 micrometers as compared to the sub-micrometer resolution achieved by conventional means. The invention then is clearly most applicable to clear the resist from the fiducial marks on the semiconductor wafer surface.

The present invention achieves the required fiducial mark clearing with a one-step, defect-free, low-resolution process.

Having described a preferred embodiment of a method and apparatus for achieving low defect etching of patterns using plasma-stencil masks, it is believed obvious that other modifications and variations of the invention will be suggested to those skilled in the art in light of the teachings set forth herein. It is therefore to be understood that changes may be made in the particular embodiment of the invention described, which changes are within the full intended scope of the invention as defined by the appended claims.

What is claimed is:

1. A method of etching a resist coating from prescribed areas on a surface of a semiconductor wafer, said method comprising the steps of:
   placing the semiconductor wafer in a vacuum chamber;
   placing an apertured stencil in said chamber in closely spaced proximity to said surface such that apertures in said stencil are aligned with said prescribed areas on said surface;
   removing said resist coating from said prescribed areas of said surface by reactive ion etching involving the further steps of:
   introducing an etching gas into said chamber, said etching gas having at least one component which reacts chemically with said resist coating to form a volatile reaction plasma; and
   bombarding said stencil with energetic charged particles to enhance the etch rate of said resist coating at said prescribed areas by said plasma located between the stencil and wafer and exposed by the stencil apertures;
   wherein the step of bombarding includes the steps of:
   applying a radio-frequency potential between a first electrode and a second electrode, wherein said wafer and mask constitutes said first electrode; and
   directing said energetic particles in a direction substantially perpendicular to said stencil.

2. The method according to claim 1 wherein each of said prescribed areas of said wafer surface contains a fiducial mark for use in aligning said wafer as one layer with other wafer layers in a multi-layer integrated circuit.

3. The method according to claim 1 wherein at least one wall of said vacuum chamber constitutes said second electrode.

4. The method according to claim 3 wherein the step of placing an apertured stencil includes spacing said stencil from said wafer surface by a distance which is, at most, twice the largest dimension of said stencil apertures.

5. The method according to claim 3 wherein the step of placing the semiconductor wafer includes disposing said wafer on a platen disposed in said chamber, and wherein the step of applying includes connecting said radio frequency potential between said platen and said second electrode.

6. The method according to claim 1 wherein the step of introducing includes delivering oxygen into said chamber.

7. The method according to claim 1 wherein the step of placing an apertured stencil includes spacing said stencil from said wafer surface by a distance which is, at most, twice the largest dimension of said stencil apertures.

8. The method according to claim 1 wherein the step of placing the semiconductor wafer includes disposing said wafer on a platen disposed in said chamber, and wherein the step of applying includes connecting said radio frequency potential between said platen and said second electrode.

9. The method according to claim 1 wherein the step of placing an apertured stencil includes spacing said stencil from said wafer surface by approximately fifty micrometers.

10. The method according to claim 9 wherein the step of placing the semiconductor wafer includes disposing said wafer on a platen disposed in said chamber, and wherein the step of applying includes connecting said radio frequency potential between said platen and said second electrode.

11. Apparatus for removing resist coating from the surface of a semiconductor wafer in the region of at least one fiducial mark on said surface, said fiducial mark being used for aligning said wafer with other wafers in a multi-wafer integrated circuit, said apparatus comprising:
   a chamber;
   pump means for exhausting gas from said chamber;
   supply means for delivering an etching gas into said chamber, said etching gas having at least one component which reacts chemically with said resist coating to form a volatile reaction plasma;
   platen means disposed in said chamber for supporting said wafer with said surface exposed and with said wafer in electrical contact with said platen means;
   a stencil having at least one aperture defined therethrough, said aperture having length and width dimensions sufficiently large to expose all of said fiducial mark;
   spacer means for supporting said stencil close to but spaced from said wafer surface with said aperture aligned with said fiducial mark, said spacer means being electrically conductive to tie said stencil to substantially the same potential as said wafer; and
   means for bombarding with energetic particles the plasma disposed between said stencil aperture and said wafer to enhance the etch rate of said resist coating by the bombarded plasma, said means for bombarding including means for directing said energetic particles in a direction substantially perpendicular to said stencil.

12. The apparatus according to claim 11 wherein said spacer means spaces said wafer surface from said stencil by a distance which is, at most, approximately twice the larger of said length and width dimensions of said aperture.

13. The apparatus according to claim 11 wherein said means for bombarding includes:
   a source of radio-frequency potential;
   first and second electrode means disposed in said chamber; and
   means connecting said radio-frequency potential between said first and second electrodes;
   wherein said platen means corresponds to said first electrode.

14. The apparatus according to claim 13 wherein said chamber has at least one electrically conductive wall spaced from said stencil by a spacing many times greater than the spacing between said wafer and said stencil, and wherein said wall corresponds to said second electrode.

15. The apparatus according to claim 14 wherein said chamber wall is electrically grounded.

16. The apparatus according to claim 15 wherein the spacing between said stencil and said wafer surface is approximately fifty micrometers.

* * * * *